United States Patent [19]
Randazzo

[11] Patent Number: 5,661,687
[45] Date of Patent: Aug. 26, 1997

[54] DRAIN EXCLUDED EPROM CELL

[75] Inventor: Todd A. Randazzo, Colorado Springs, Colo.

[73] Assignee: Symbios Logic Inc., Fort Collins, Colo.

[21] Appl. No.: 720,601

[22] Filed: Mar. 30, 1996

[51] Int. Cl.$^6$ .................................................. G11C 13/00
[52] U.S. Cl. .......................... 365/185.24; 365/185.28; 257/316; 257/336; 257/344
[58] Field of Search ........................ 365/185, 189.01, 365/189.06, 230.01, 230.06

[56] References Cited

U.S. PATENT DOCUMENTS

| | | | |
|---|---|---|---|
| 4,132,904 | 1/1979 | Harari | 307/238 |
| 4,663,645 | 5/1987 | Komori et al. | 357/23.5 |
| 4,672,580 | 6/1987 | Yau et al. | 365/185 |
| 4,775,642 | 10/1988 | Chang et al. | 437/44 |
| 4,788,663 | 11/1988 | Tanaka et al. | 365/185 |
| 4,918,501 | 4/1990 | Komori et al. | 357/23.5 |
| 4,935,802 | 6/1990 | Noguchi et al. | 357/54 |
| 4,972,371 | 11/1990 | Komori et al. | 365/185 |
| 5,065,362 | 11/1991 | Herdt et al. | 365/154 |
| 5,095,344 | 3/1992 | Harari | 357/23.5 |
| 5,098,855 | 3/1992 | Komori et al. | 437/52 |
| 5,153,144 | 10/1992 | Komori et al. | 437/43 |
| 5,172,200 | 12/1992 | Muragishi et al. | 257/315 |
| 5,172,338 | 12/1992 | Mehrotra et al. | 365/185 |
| 5,189,640 | 2/1993 | Hurard | 365/154 |
| 5,194,924 | 3/1993 | Komori | 257/316 |
| 5,220,533 | 6/1993 | Turner | 365/218 |
| 5,241,498 | 8/1993 | Yokokura | 365/185 |
| 5,267,209 | 11/1993 | Yoshida | 365/218 |
| 5,278,794 | 1/1994 | Tanaka et al. | 365/200 |
| 5,280,446 | 1/1994 | Ma et al. | 365/185 |
| 5,283,759 | 2/1994 | Smith | 365/185 |
| 5,299,162 | 3/1994 | Kim et al. | 365/201 |
| 5,352,620 | 10/1994 | Komori et al. | 437/52 |
| 5,353,248 | 10/1994 | Gupta | 365/154 |
| 5,355,007 | 10/1994 | Smayling | 257/231 |
| 5,361,224 | 11/1994 | Takasu | 365/145 |
| 5,373,465 | 12/1994 | Chen et al. | 365/185 |
| 5,386,422 | 1/1995 | Endoh et al. | 371/21.5 |
| 5,399,917 | 3/1995 | Allen et al. | 327/436 |
| 5,412,238 | 5/1995 | Chang | 257/321 |
| 5,453,388 | 9/1995 | Chen et al. | 437/30 |
| 5,455,790 | 10/1995 | Hart et al. | 365/185.11 |
| 5,460,998 | 10/1995 | Liu | 437/57 |

*Primary Examiner*—Terrell W. Fears
*Attorney, Agent, or Firm*—John R. Ley; Wayne P. Bailey

[57] ABSTRACT

An electrically programmable floating gate memory cell is gate programmed with tunneling electrons and is not drain erasable. The memory cell comprises a semiconductor substrate, source and drain regions disposed in the semiconductor substrate, a floating gate conductor adjacent to the source and drain regions, a tunnel oxide layer disposed between the floating gate conductor and the source and drain regions, and a control gate conductor adjacent to the floating gate conductor. The source and drain regions each include a high impurity concentration portion and a low impurity concentration portion. The impurity concentration of the low impurity concentration portion is sufficiently low to prevent a substantial threshold voltage variation when a predetermined range of voltages are supplied in a first polarity between the control gate conductor and the drain region.

17 Claims, 3 Drawing Sheets

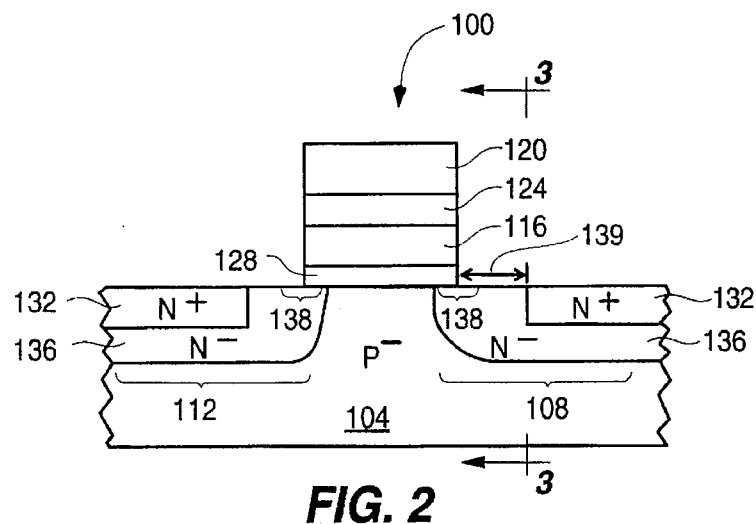
FIG. 2
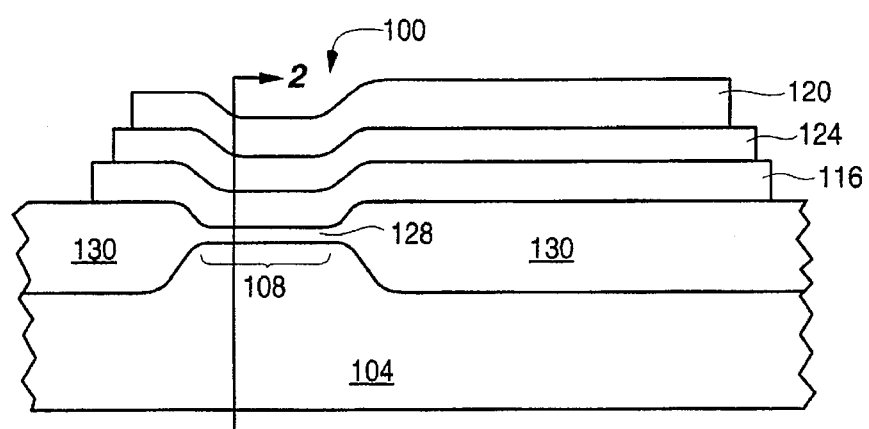
FIG. 3
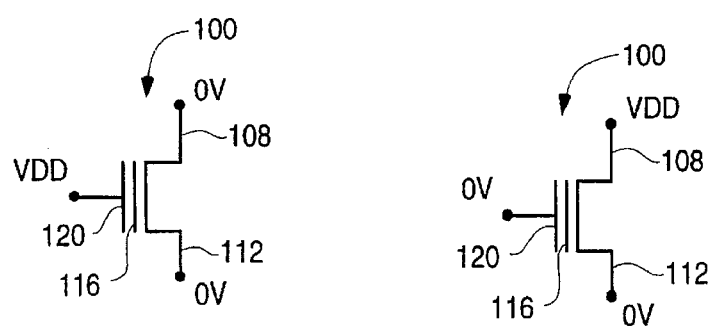
FIG. 4          FIG. 5

DRAIN EXCLUDED EPROM CELL

FIELD OF THE INVENTION

This invention relates to non-volatile memory and, in particular, to an electrically programmable read only memory (EPROM) cell that includes a floating gate transistor which is programmed by tunneling electrons in response to a predetermined gate voltage and which has a low density diffusion region within its source and drain regions to prevent erasure in response to a predetermined range of drain voltages.

BACKGROUND OF THE INVENTION

A conventional floating gate transistor 10 which is used in an EPROM cell is shown in FIG. 1. The transistor 10 includes a semiconductor substrate 14 with a drain region 18 and a source region 22 defined therein, a floating gate 26, and a control gate 30. A thin insulating film 34 is interposed between, and electrically insulates, the floating gate 26 from the control gate 30. Another thin insulating film 38 is interposed between, and electrically insulates, the floating gate 26 from the drain 18 and the source 22.

The floating gate 26 accumulates electrical charge that increases a threshold voltage level which must be supplied to the control gate 30 to generate conduction in a channel region 42 between the drain 18 and the source 22. The amount of electrical charge in the floating gate and, correspondingly, the magnitude of the threshold voltage, defines a binary memory state which may be represented by the transistor 10. A first memory state is represented when the threshold voltage is less than or equal to a predetermined magnitude and an opposite second memory state is represented when the threshold voltage exceeds the predetermined magnitude. The transistor 10 is programmed from the first memory state to the second memory state by increasing the threshold voltage of the transistor 10 to at least the level of the threshold magnitude.

The threshold voltage of the floating gate 26 is increased by supplying predetermined voltage levels to the transistor 10 which are sufficient to generate a high magnitude avalanche current within the channel region 42. High energy ("hot") electrons in the channel region 42 penetrate through the thin insulating film 38 to the floating gate 26 to increase the electrical charge in the floating gate 26, as is well known in the art. The thin insulating film 38 prevents the loss of electrical charge from the floating gate 26 after the supplied predetermined voltage levels are removed.

The memory state of the transistor 10 is determined or read by applying a predetermined read voltage to the control gate 30 and a predetermined sense voltage between the source and drain regions, 22 and 18, to sense whether the channel region 42 is conductive, indicating the first memory state, or nonconductive, indicating the second memory state. When the channel region 42 is conductive, a current flows between the source 22 and the drain 18.

Whenever the channel region 42 conducts current, such as while the memory state is read, hot electrons from the source-drain current can cross the thin insulating film 38 and change the amount of charge in the floating gate 26, which is known as a soft write effect. Consequently, over time the memory state of the transistor 10 can be erroneously changed during the normal operation of the transistor 10. The conventional solution to minimizing the soft write effect has been to limit the drain voltage to a relatively low magnitude.

To suppress the generation of hot electrons when the transistor 10 is read, the drain and source regions, 18 and 22, each include a high impurity concentration N+ type region 46 and a low impurity concentration N– type region 50, such as are disclosed in U.S. Pat. No. 5,241,498. The resistance of the N– region 50 is substantially greater than the resistance of the N+ region 46, which substantially reduces the magnitude of the avalanche current in the channel region 42. When the memory state of the transistor 10 is read, the N– region sufficiently suppresses the generation of hot electrons to minimize any soft write effect. When the transistor 10 is programmed from the first memory state to the second memory state, the N– region 50 has the undesirable effect of suppressing the generation of hot electrons in the channel region 42 which substantially increases the length of time which is required to raise the threshold voltage of the transistor 10 to the level which is indicative of the second memory state. Consequently, to enable the transistor 10 to be programmed in a reasonably fast time duration, the N– region 50 has an impurity concentration of substantially more than $1 \times 10^{14}$ ions/cm$^2$.

Some flash type electrically-programmable electrically-erasable memory (flash EEPROM) cells include a transistor which, in contrast to the EPROM transistor 10 (FIG. 1), is programmed and erased by causing electrons to tunnel in either direction between its drain and floating gate in response to predetermined voltages.

It is with respect to this and other background information that the present invention has evolved.

SUMMARY OF THE INVENTION

The present invention relates to an electrically programmable read only memory (EPROM) cell that includes a floating gate transistor which is tunnel programmed in response to a predetermined gate voltage and which is not tunnel erased when a predetermined range of voltages are supplied to the drain.

The present invention is directed to an electrically programmable floating gate memory cell which comprises a semiconductor substrate, source and drain regions disposed apart in the semiconductor substrate, a floating gate conductor adjacent to the source and drain regions, a tunnel oxide layer disposed between the floating gate conductor and the source and drain regions, and a control gate conductor adjacent to the floating gate conductor. The source and drain regions each include a high impurity concentration portion and a low impurity concentration portion. The impurity concentration of the low impurity concentration portion is sufficiently low to prevent a substantial threshold voltage variation when a predetermined range of voltages are supplied in a first polarity between the control gate conductor and the drain region.

According to further aspects of the present invention, the tunnel oxide layer has a predetermined thickness which is sufficient for electrons to tunnel between the drain region and the floating gate conductor and cause a substantial voltage variation when a predetermined programming voltage is supplied in a second polarity, which is opposite to the first polarity, between the control gate conductor and the drain region. The low impurity concentration portion of the drain region substantially prevents electron tunneling between the high impurity concentration portion of the drain region and the floating gate conductor when the predetermined range of voltages are supplied in the first polarity between the control gate conductor and the drain region.

Consequently, the memory cell is programmed by electron tunneling and is not erased when a predetermined range of voltages are supplied to the drain. Programming the threshold voltage of the memory cell by electron tunneling through the tunnel oxide film instead of by hot electron generation in a channel region has advantages which include a substantial reduction in the power consumed by the transistor. Preventing erasure of the memory cell in response to drain voltages provides reliable non-volatile storage of a programmed threshold voltage. The low power and nonerasure characteristics of the memory cell are desirable for EPROM cells.

A more complete appreciation of the present invention and its scope can be obtained by reference to the accompanying drawings, which are briefly summarized below, the following detailed description of presently preferred embodiments of the invention, and the appended claims.

BRIEF DESCRIPTION OF THE DRAWINGS

FIGS. 2 and 3 are cross-section views of an EPROM transistor incorporating the present invention, with FIG. 2 being taken along section line 2—2 of FIG. 3 and with FIG. 3 being taken along section line 3—3 of FIG. 2.

FIG. 4 is a schematic diagram of the EPROM transistor shown in FIG. 2 showing voltage signals which cause programming of the transistor.

FIG. 5 is a schematic diagram of the EPROM transistor shown in FIG. 2 showing voltage signals which cause erasure of the transistor.

DETAILED DESCRIPTION

Figure 1:
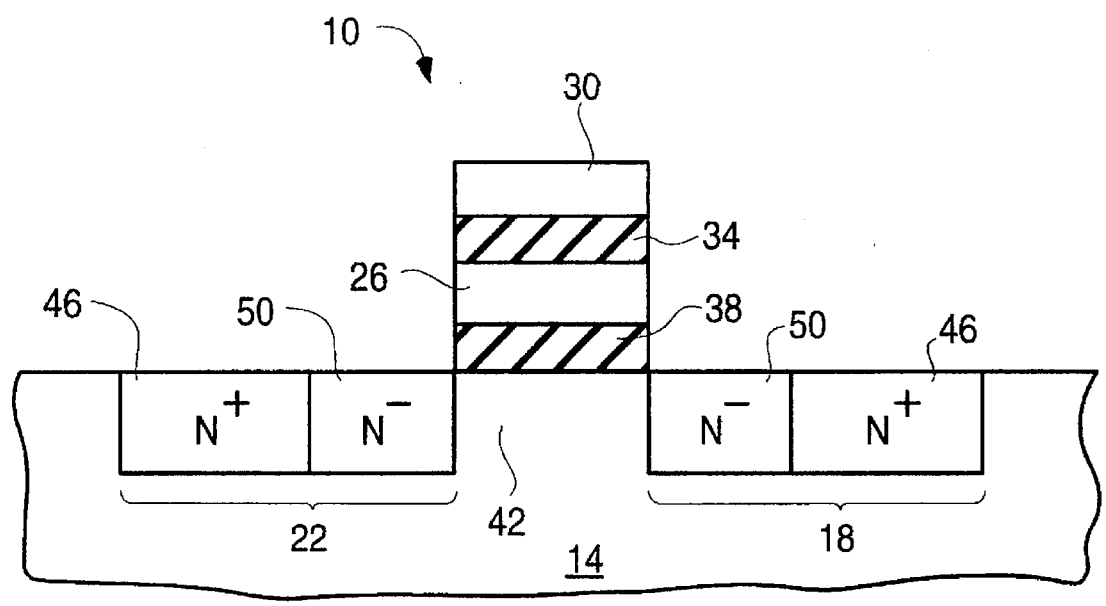
FIG. 1 is a cross-section view illustrating a prior art EPROM transistor.

An electrically programmable read only memory (EPROM) transistor 100 according to one embodiment of the present invention is shown in FIGS. 2 and 3. The transistor 100 includes a P type silicon substrate 104 with a drain region 108 and a source region 112 defined therein, a floating gate 116, and a control gate 120. The drain region 108 and the source region 112 each comprise a high impurity concentration N+ type area 132 and a low impurity concentration N– type area 136. The N+ area 132 typically has an impurity concentration of between about $1 \times 10^{15}$ ions/cm$^2$ to $6 \times 10^{15}$ ions/cm$^2$. The low impurity concentration N– area 136 has an impurity concentration of less than about $10^{14}$ ions/cm$^2$.

The floating gate 116 and the control gate 120 are formed of polycrystalline silicon, monocrystalline silicon, amorphous silicon, or metal. The control gate 120 overlies the floating gate 116 with an insulating film 124, such as a silicon oxide film, interposed therebetween to capacitively couple the floating gate 116 to the control gate 120. The floating gate 116 overlies a segment of the substrate 104 with a tunnel oxide film 128, such as a thin film of silicon oxide, interposed therebetween to capacitively couple the floating gate 116 to the drain and source regions 108 and 112. The transistor 100 is electrically isolated from any adjacent circuitry in the substrate 104 by an electrically insulating segment 130, such as silicon oxide, which is defined in the substrate 104.

Voltage signals which can cause programming of transistor 100 are illustrated in FIGS. 2 and 3. When 0 volts is supplied to the drain and source regions, 108 and 112, and a positive programming voltage (VDD) is supplied to the control gate 120, the capacitive coupling between the control gate 120 and the floating gate 116 causes a substantial electric field between the floating gate 116 and the drain and source regions, 108 and 112, across the tunnel oxide layer 128. The tunnel oxide film 128 is sufficiently thin so that when the VDD signal (FIG. 4) is raised to a predetermined programming voltage (i.e. 1.5 to 5 times greater than the normal operating voltage of the transistor 100), a sufficient quantity of electrons tunnel from the N+ region 132 of the drain 108, through the low impurity concentration N– area 136 and the tunnel oxide layer 128, to the floating gate 116 to raise the threshold voltage of the transistor 100 above a predetermined magnitude (i.e. the transistor is "gate programmed"). The tunnel oxide film 128 preferably has a thickness of less than about 120 Angstroms. Programming the threshold voltage of the transistor 100 using the principle of electron tunneling through the tunnel oxide film 128 instead of using the principle of hot electron generation in a channel region, such as used for the transistor 10 shown in FIG. 1, has advantages which include a substantial reduction in the power consumed by the transistor 100.

In addition to enabling gate programming, the thin tunnel oxide film 128 also encourages erasure of the programmed threshold voltage by electron tunneling from the floating gate 116 to the N+ region 132 of the drain 108 when voltage signals are supplied as shown in FIG. 5 to the transistor 100. However, such erasure is undesirable in many EPROM cell circuits which require transistors in which the threshold voltage is not substantially changed when the programming voltage is supplied to the drain (i.e. the transistor is not "drain erasable"). For example, a transistor which is gate programmable by tunneling electrons and not drain erasable can advantageously be used in the non-volatile memory cell which is disclosed in the U.S. patent application entitled "Non-Volatile Memory Which is Programmable From a Power Source", Ser. No. (Docket No. 95-080), filed Jun. 28, 1996, which is assigned to the Assignee hereof.

To prevent drain eraseability of the transistor 100, the N+ area 132 is spatially disposed horizontally from underneath the floating gate 116 by a predetermined distance 139 that is sufficient to place the N+ area 132 outside of any concentrated electric field which occurs underneath the edges of the floating gate 116. To enable gate programmability, the low impurity concentration N– area 136 extends from the N+ area 132 to underneath the floating gate 128.

When the voltage signals are supplied as shown in FIG. 5 to the transistor 100, the low impurity concentration N– area 136 functions as a voltage divider. The voltage divider causes the electric field between the drain region 108 and the floating gate 116 to be split across the tunnel oxide layer 128 and also causes a depletion region 138 (FIG. 2) in the low impurity concentration N– area 136. The depletion region substantially prevents electrons from tunneling from the floating gate 116, through the tunnel oxide layer 128, to the N+ area 132 of the drain 108. Consequently, the threshold voltage of the transistor 900 remains substantially unchanged.

An impurity concentration of less than about $10^{14}$ ions/cm$^2$ in the low impurity concentration N– area 136 substantially reduces any erasure of the transistor 100 when the programming voltage is applied to the drain while an impurity concentration of less than or equal to $10^{13}$ ions/cm$^2$ substantially eliminates any erasure.

Figure 6:
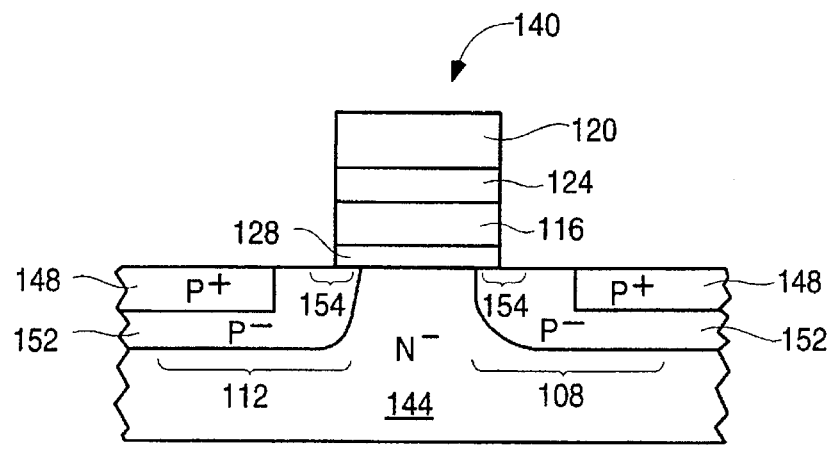
FIG. 6 is a cross-section view of another embodiment of the EPROM transistor of the present invention which is an alternate to the EPROM transistor shown in FIG. 2.

FIG. 6 shows a transistor 140 which has a similar structure to the transistor 100 which is shown in FIGS. 2 and 3 but, in contrast, has opposite types of doped impurities. In particular, transistor 140 includes an N-type substrate 144, a high impurity concentration P+ type area 148, and a low impurity concentration P− type area 152.

Figure 7:
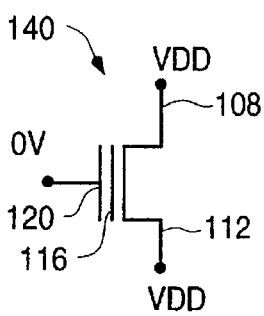
FIG. 7 is a schematic diagram of the EPROM transistor shown in FIG. 6 showing voltage signals which cause programming of the transistor.

The transistor 140 is tunnel programmed by applying the programming voltage level to the drain and source regions, 108 and 112, as shown in FIG. 7, so that the electric field is concentrated between the floating gate 116 and the drain and source regions, 108 and 112, across the tunnel oxide layer 128.

Figure 8:
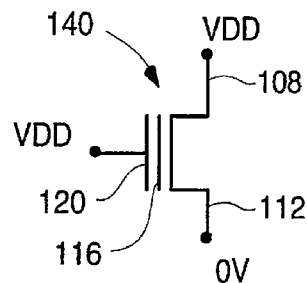
FIG. 8 is a schematic diagram of the EPROM transistor shown in FIG. 6 showing voltage signals which cause erasure of the transistor.

In contrast, when voltages are supplied as shown in FIG. 8, the low impurity concentration P− type area 152 functions as a voltage divider which causes the electric field between the drain region 108 and the floating gate 116 to be split across the tunnel oxide layer 128 and also causes a depletion region 154 (FIG. 6) in the low impurity concentration P− area 152. The depletion region 152 substantially prevents electrons from tunneling from the P+ area 148 of the drain 108, through the tunnel oxide layer 128, to the floating gate 116. Consequently, the transistor 140 is gate programmable by tunneling electrons and is not drain erasable.

Figure 9:
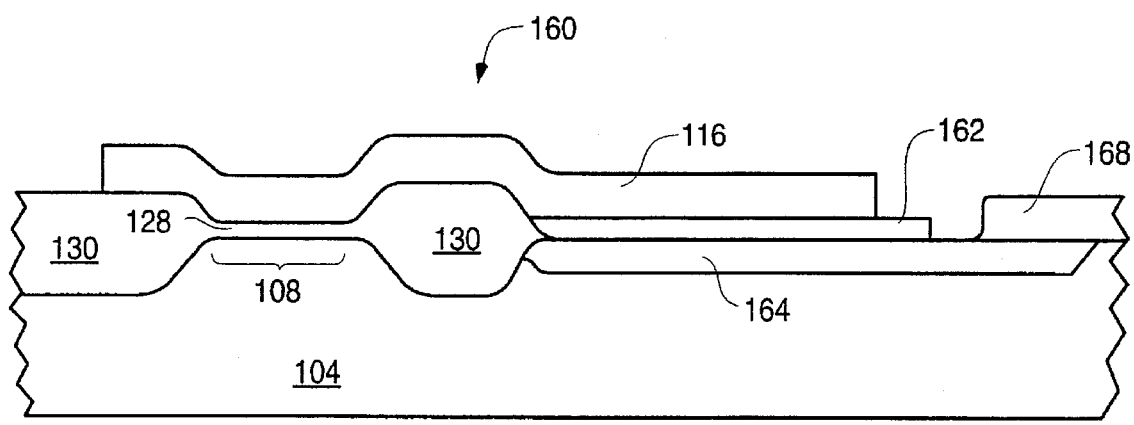
FIG. 9 is a cross-section view of another embodiment of the EPROM transistor of the present invention, which is an alternate to the EPROM transistor shown in FIG. 2.

FIG. 9 shows a transistor 160 which has a similar structure to the transistor 100 which is shown in FIG. 3 but, in contrast, has a control gate 168 which is adjacent to, but not overlying, the floating gate 116. The floating gate 116 overlies a conductive channel 164 which is defined in the substrate 104. An insulating film 162, such as a silicon oxide film, is interposed between the floating gate 116 and the conductive channel 164. The conductive channel 164 is electrically connected to the control gate 168. Consequently, the floating gate 116 is capacitively coupled to the adjacent control gate 168. The tunnel oxide film 128 overlies the drain and source regions, 108 and 112 (FIG. 2), which include the N+ region 132 (FIG. 2) and the low impurity concentration N− area 136 (FIG. 2), the same as shown in FIG. 2, to also achieve gate programmability with tunneling electrons while preventing drain eraseability.

The electrically programmable floating-gate memory cell of the present invention is programmed by tunneling electrons in response to a predetermined gate voltage, and prevents erasure when a predetermined range of voltages are supplied to the drain. Programming the memory cell by electron tunneling through a tunnel oxide film instead of by hot electron generation in a channel region has advantages which include a substantial reduction in the power consumed by the transistor. Preventing erasure of the memory cell in response to drain voltages provides long term stability for a memory state of the transistor. The low power and nonerasure characteristics of the memory cell are desirable for EPROM cells.

The presently preferred embodiment of the invention and its improvements have been described with a degree of particularity. This description has been made by way of preferred example. It should be understood that the scope of the present invention is defined by the following claims, and should not necessarily be limited by the detailed description of the preferred embodiment set forth above.

The invention claimed is:

1. An electrically programmable read only memory (EPROM) cell comprising:

a semiconductor substrate;

source and drain regions disposed horizontally apart in the semiconductor substrate, the source and drain regions each including a high impurity concentration portion and a low impurity concentration portion;

a floating gate conductor vertically spaced from and adjacent to the source and drain regions;

a tunnel oxide layer disposed between the floating gate conductor and the source and drain regions; and a control gate conductor adjacent to the floating gate conductor; and wherein the impurity concentration of the low impurity concentration portion is sufficiently low to prevent a substantial threshold voltage variation when a predetermined range of voltages is supplied in a first polarity between the control gate conductor and the drain region.

2. An EPROM cell as defined in claim 1 wherein:

the tunnel oxide layer has a predetermined thickness which is sufficient for electrons to tunnel between the drain region and the floating gate conductor and to cause a substantial threshold voltage variation when a predetermined programming voltage is supplied in a second polarity, which is opposite to the first polarity, between the control gate conductor and the drain region.

3. An EPROM cell as defined in claim 2 wherein:

the tunnel oxide layer allows electrons to tunnel between the high impurity concentration portion of the drain region and the floating gate and to cause a substantial threshold voltage variation in response to the predetermined programming voltage supplied in the second polarity between the control gate conductor and the drain region.

4. An EPROM cell as defined in claim 1 wherein:

the tunnel oxide layer overlies a segment of the low impurity concentration portions of the source and drain regions.

5. An EPROM cell as defined in claim 1 wherein:

the tunnel oxide layer has a substantially constant thickness between the low impurity concentration portion of the source and drain regions.

6. An EPROM cell as defined in claim 1 wherein:

the tunnel oxide layer has a thickness of less than about 120 Angstroms.

7. An EPROM cell as defined in claim 1 wherein:

the floating gate conductor overlies a segment of the low impurity concentration portion of the source and drain regions.

8. An EPROM cell as defined in claim 1 wherein:

the low impurity concentration portion of the drain region has a sufficiently low impurity concentration to substantially prevent electron tunneling between the high impurity concentration portion of the drain region and the floating gate conductor.

9. An EPROM cell as defined in claim 1 wherein:

the low impurity concentration portions of the source and drain regions and the semiconductor substrate form a voltage divider when the predetermined range of voltages are supplied in the first polarity between the drain region and the control gate conductor, and the voltage divider divides an electric field between the low impurity concentration portions and the tunnel oxide layer to prevent a substantial threshold voltage variation.

10. An EPROM cell as defined in claim 1 wherein:

the low impurity concentration portion of the source and drain regions has an impurity concentration of less than about $10^{14}$ ions/cm$^2$.

11. An EPROM cell as defined in claim 1 wherein:
the low impurity concentration portion of the source and drain regions has an impurity concentration of less than or equal to $10^{13}$ ions/cm$^2$.

12. An EPROM cell as defined in claim 1 wherein:
the control gate conductor overlies the floating gate conductor.

13. An EPROM cell as defined in claim 1 further comprising:
a channel region defined within the semiconductor substrate between the source and drain regions; and wherein,
a portion of the floating gate conductor is disposed vertically adjacent to the channel region and is capacitively coupled to the control gate conductor.

14. An electrically programmable read only memory (EPROM) cell comprising:
a semiconductor substrate;
source and drain regions disposed horizontally apart in the semiconductor substrate;
a floating gate conductor vertically spaced from and adjacent to the source and drain regions; and
a control gate conductor adjacent to the floating gate conductor;
means for allowing electrons to tunnel between the drain region and the floating gate conductor to cause a substantial threshold voltage variation when a predetermined programming voltage is supplied in a first polarity between the control gate conductor and the drain region.

15. An EPROM cell as defined in claim 14, wherein the means for allowing electrons to tunnel comprises:
a tunnel oxide layer disposed between the floating gate conductor and the source and drain regions, the tunnel oxide layer has a predetermine thickness which is sufficient for electrons to tunnel between the drain region and the floating gate conductor and to cause a substantial threshold voltage variation when the predetermined programming voltage is supplied between the control gate conductor and the drain region.

16. An EPROM cell as defined in claim 14, further comprises:
means for preventing electrons from tunneling between the drain region and the floating gate conductor and causing a substantial threshold voltage variation when a predetermined range of voltages are supplied in a second polarity, which is opposite to the first polarity, between the control gate conductor and the drain region.

17. An EPROM cell as defined in claim 16, wherein the means for preventing electrons from tunneling comprises:
low impurity concentration regions of the drain and source regions and which underlie at least a portion of the floating gate conductor.

* * * * *

UNITED STATES PATENT AND TRADEMARK OFFICE
CERTIFICATE OF CORRECTION

PATENT NO. : 5,661,687
DATED : August 26, 1997
INVENTOR(S) : Todd A. Randazzo

It is certified that error appears in the above-indentified patent and that said Letters Patent is hereby corrected as shown below:

Title page, after "Filed:", delete "Mar. 30, 1996" and insert --Sept. 30, 1996--.

Signed and Sealed this

Tenth Day of February, 1998

Attest:

BRUCE LEHMAN

Attesting Officer

Commissioner of Patents and Trademarks